United States Patent [19]
Kamon

[11] Patent Number: 5,317,450
[45] Date of Patent: May 31, 1994

[54] PROJECTION EXPOSURE APPARATUS
[75] Inventor: Kazuya Kamon, Itami, Japan
[73] Assignee: Mitsubishi Denki Kabushiki Kaisha, Tokyo, Japan
[21] Appl. No.: 972,419
[22] Filed: Nov. 5, 1992
[30] Foreign Application Priority Data Dec. 17, 1991 [JP] Japan .................. 3-333334

[51] Int. Cl.⁵ .............. G02B 5/04; G02B 27/12; G03B 27/42; G03B 27/52
[52] U.S. Cl. ................ 359/566; 355/53; 359/615; 359/837
[58] Field of Search .......... 359/615, 566, 837; 355/53; 372/100

[56] References Cited
U.S. PATENT DOCUMENTS

| 3,179,899 | 4/1965 | Fox | 372/100 |
| 3,435,370 | 3/1969 | Harris et al. | 372/100 |
| 3,959,740 | 5/1976 | Dewhirst | 372/100 |
| 4,063,106 | 12/1977 | Ashkin et al. | 372/100 |
| 4,739,373 | 4/1988 | Nishi et al. | 355/53 |
| 4,782,368 | 11/1988 | Ogawa et al. | 355/53 |
| 4,922,290 | 5/1990 | Yoshitake et al. | 355/53 |
| 5,097,291 | 3/1992 | Suzuki | 355/53 |
| 5,144,362 | 9/1992 | Kamon et al. | 355/53 |
| 5,191,374 | 3/1993 | Hazama et al. | 355/53 |

Primary Examiner—Martin Lerner
Attorney, Agent, or Firm—Leydig Voit & Mayer

[57] ABSTRACT

A projection exposure apparatus that provides uniform illumination with at least partially incoherent light that could produce interference fringes. The projection exposure apparatus includes a light source emitting at least partially coherent light, a dispersion element for dispersing the light according to wavelength, a dividing element for dividing the dispersed light into plural light beams, a condenser unit for introducing each of the plural light beams in an overlapping manner onto a mask including circuit patterns, and a projection lens unit for projecting the light passing through the mask onto a surface of a wafer.

16 Claims, 6 Drawing Sheets

PROJECTION EXPOSURE APPARATUS

BACKGROUND OF THE INVENTION

1. Field of the Invention

The present invention relates to a projection exposure apparatus (projection printer) in use for LSI fabrication processes.

2. Description of the Related Art

FIG. 6 shows an optical system of a conventional projection printer. A fly-eye lens unit 3 is arranged in front of a lamp 1 and a mirror 2. In front of the fly-eye lens unit 3, an aperture unit 4, condensers 5 and 6, and a mirror 7 are located. A mask 8 including desired circuit patterns is next to the condensing lens 6. A wafer 10 and a projection lens unit 9 are placed in front of the mask 8. Fly-eye lens unit 3 has a fly-eye lens 12 fixed to an outer frame 13. As shown in FIG. 7, the fly-eye lens 12 comprises a plurality of identical lenses 11 having a rectangular shape in a plan view which are arranged in a two-dimensional array. The line on the fly-eye lens unit 3 designated by alternating long and short dashes corresponds to the edge of an aperture 4a of the aperture unit 4. In FIG. 6, the outer frame 13 of the fly-eye lens unit 3 is not shown and the number of element lenses 11 is reduced for simplicity.

Light emitted from the lamp 1 is introduced to the fly-eye lens unit 3 via the mirror 2. Light which is incident into each element lens 11 of the fly-eye lens unit 3 illuminates all of the mask 8 via the aperture 4a of the aperture unit 4, the condenser 5, the mirror 7, and condenser 6. In FIG. 6, there are shown only light beams which pass through element lenses 11 located at the central part of the fly-eye lens unit 3 to illuminate the mask 8, but light beams passing through the other element lenses 11 also illuminate the mask 8 in similar way so that the whole exposure area is illuminated. As a result, the light beams from each element lens 11 of the fly-eye lens unit overlap on the surface of the mask 8; thus, uniform illumination is achieved. Furthermore, after passing through the mask 8, the light reaches the wafer 10 via the projection lens unit 9 to transfer the circuit patterns onto the surface of the wafer 10.

In such a projection printer, it is known that the illumination with shorter wavelength light results in better resolution suitable for exposure of finer patterns. Therefore, use of an excimer laser producing far ultraviolet wavelength light has been investigated.

However, the laser beam emitted from an excimer laser exhibits high coherence, hence interference patterns appear on the surface of mask 8 also on the surface of wafer 10 when it is used as a light source in the projection printer of FIG. 6. Such irregularity in the illumination is a problem to be solved.

SUMMARY OF THE INVENTION

It is an object of the present invention to solve the problems described above. More specifically, it is an object of the present invention to provide a projection printer which offers uniform illumination, notwithstanding illumination with light which could bring about interference.

A projection printer of the present invention comprises a light source which emits coherent light or partially coherent light;

dispersion means for dispersing the light, emitted from the light source into various wavelengths, dividing means for dividing the light dispersed into various wavelengths by the dispersion means into plural light beams;

a condenser for introducing each of the plural light beams from the dividing means onto a mask including circuit patterns so that the plural light beams overlap; and a projection lens for projecting the light passing through the mask onto a surface of a wafer.

DESCRIPTION OF THE PREFERRED EMBODIMENTS

Referring to the attached figures, embodiments of the present invention are described below.

Figure 1:
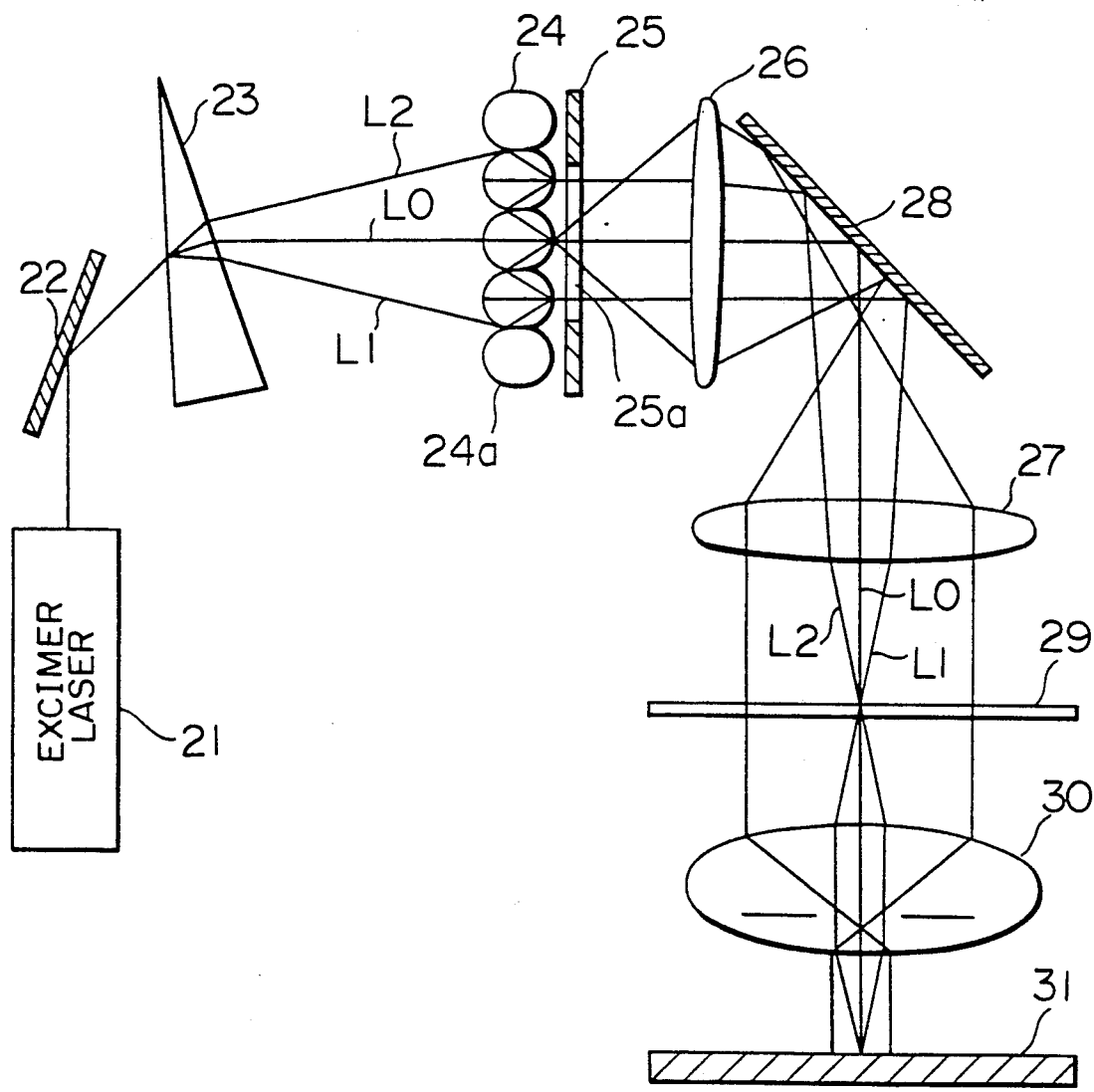
FIG. 1 is a schematic diagram showing an optical system of a projection printer of a first embodiment of the present invention.

In FIG. 1, a prism 23 is arranged in front of an excimer laser oscillator 21 with an intervening mirror 22. In front of the prism 23 are arranged a fly-eye lens unit 24 and an aperture unit 25. An exposure mask 29 including desired circuit patterns is disposed along an optical path including condensers 26 and 27 and a mirror 28 between the condensers. In front of the mask 29, a wafer 31 is placed with an intervening projection lens unit 30. The excimer laser oscillator 21 emits coherent light. The prism 23 disperses the light from the excimer laser. The fly-eye lens unit 24 divides the light and the condensers 26 and 27 and the mirror 28 condense the light. Achromatic lenses are used for each of the lenses.

The operation of this embodiment is as follows. Coherent light emitted from the excimer laser oscillator 21 is reflected at the mirror 22, then is incident on the prism 23. The prism 23 disperses the coherent light into light beams of wavelength of $\lambda$ to $\lambda + \Delta\lambda$. In FIG. 1, in addition to light L0 passing along the optical axis of the condenser unit, light L1 and light L2 are also shown which have wave lengths $\lambda$ and $\lambda + \Delta\lambda$. Light is introduced to the fly-eye lens unit 24 after the dispersion. Light is incident on each element lens 24a of the fly-eye lens unit, and then passes through an aperture 25a of the aperture unit 25, the condenser 26, the mirror 28, and the condenser 27, thus illuminating the whole exposure area of mask 29. In this way, light beams from each element lens 24a of the fly-eye lens unit 24 overlap on the surface of the mask 29; thus, the mask is illuminated uniformly. Furthermore, after passing through the mask 29, the light reaches the wafer 31 via the projection lens unit 30 to transfer circuit patterns to the surface of the wafer 31.

Figure 2:
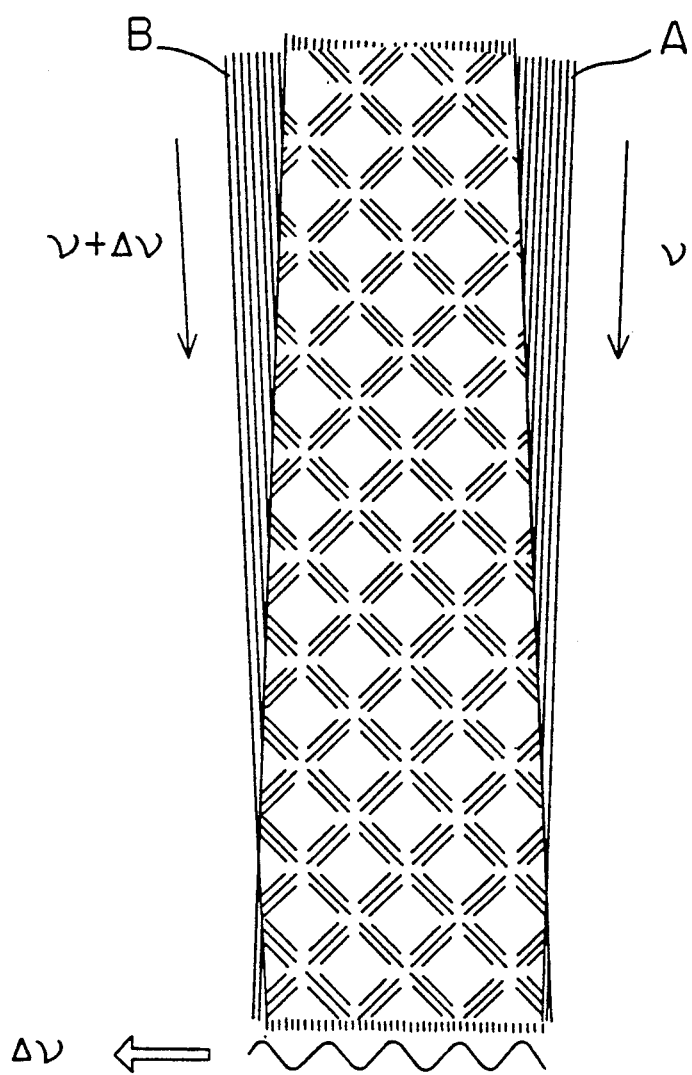
FIG. 2 is a schematic diagram showing operation of the embodiment.

The light emitted from the excimer laser oscillator 21 exhibits high coherence. Therefore, when light beams from each element lens 24a of the fly-eye lens unit 24 overlap on the surface of the mask 29, there appear interference patterns as shown in FIG. 2. However, because the light emitted from the excimer laser oscillator 21 is dispersed by the prism 23 into light beams of wavelengths of $\lambda$ to $\lambda + \Delta\lambda$, light beams which differ in wavelength from each other, i.e., differ in frequency from each other, and overlap on the surface of the mask 29. As a result, a heterodyne beat appears. When, for example as shown in FIG. 2, a light beam A of frequency $\nu$ and a light beam B of frequency $\nu + \Delta\nu$ overlap to form a interference pattern, the resulting interference pattern is swept by frequency $\Delta\nu$ due to the heterodyne beat. Accordingly, the light intensity distribution on the surface of the mask 29 is averaged with respect to the time. Thus, illumination irregularities due to the interference pattern are avoided.

If the sweep is carried out by several wavelengths during an exposure, then the light intensity distribution is averaged enough. This means that light intensity distribution can be averaged well enough during an ordinary exposure time.

Figure 3:
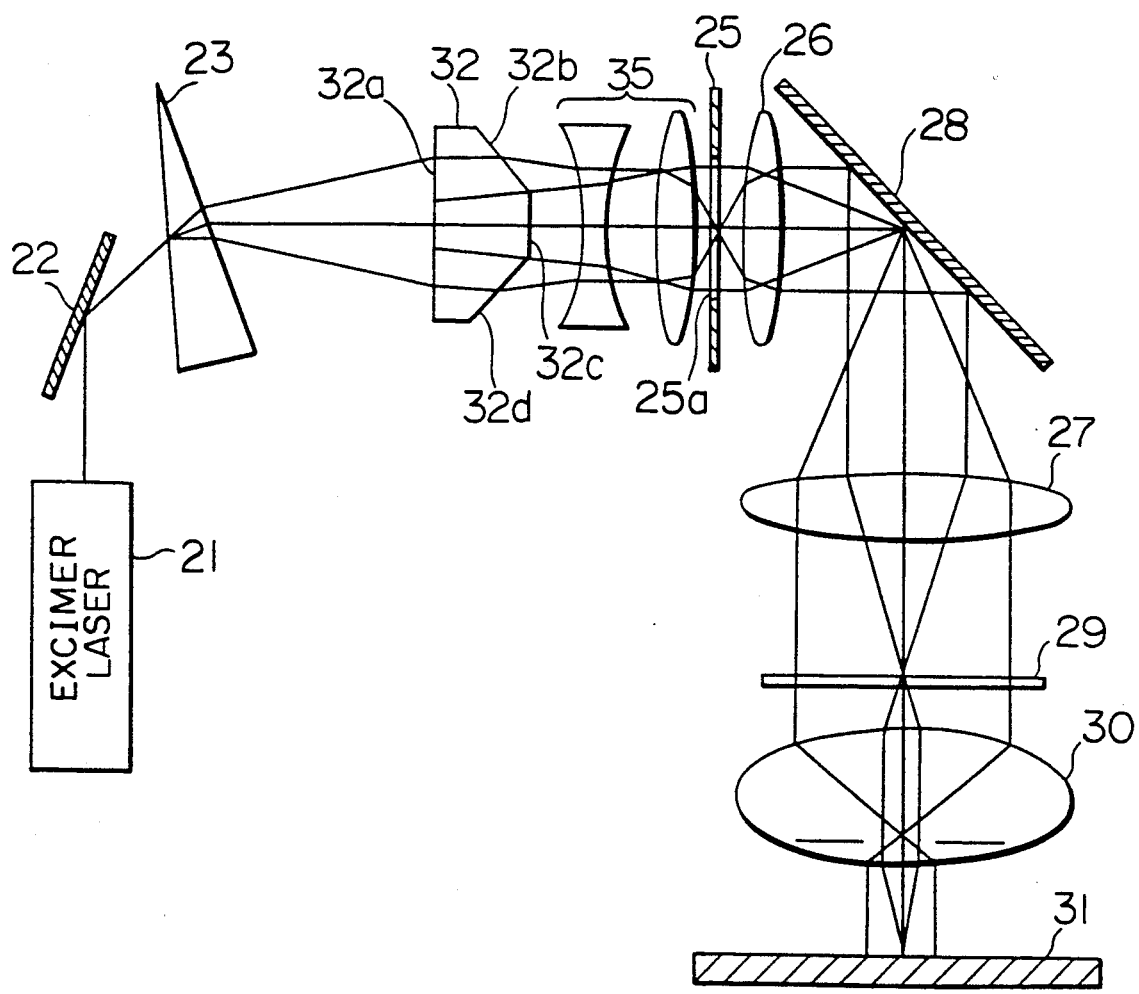
FIG. 3 is a schematic diagram showing an optical system of a second embodiment.

FIG. 3 shows an optical system of a projection printer of a second embodiment of the present invention. In this second embodiment, a polyhedron prism 32 having an antireflection coating is used as a dividing means instead of a fly-eye lens unit 24. After coherent light is dispersed by a prism 23 into various wavelengths, the light beams are incident into the largest principal surface 32a of the polyhedron prism 32 and emerge divided from surfaces 32b, 32c, and 32d, into plural light beams corresponding to each surface 32b, 32c, and 32d. These light beams illuminate the whole exposure area of the mask 29 via a relay lens unit 35, an aperture 25a of an aperture unit 25, a condenser 26, a mirror 28, and a condenser 27. As a result, these light beams from each surface 32b, 32c, and 32d of the polyhedron prism 32 overlap each other, and uniform illumination is achieved. Furthermore, after passing through the mask 29, the light reaches the wafer 31 via the projection lens unit 30 to transfer circuit patterns to the surface of the wafer 31.

When a fly-eye lens unit 24 is used as a dividing means, light diverges at each element lens 24a of the fly-eye lens unit 24 and part of the light diverging from element lenses 24a at the periphery of the fly-eye lens unit 24 does not arrive at the condenser 26 but is scattered. In contrast, when a polyhedron prism 32 is used as in the second embodiment, all light incident into the largest principal surface 32a of the prism 32 emerges from surfaces 32b, 32c, and reaches the condenser 26 via relay lens unit 35 with no scattering. Therefore, it is possible to reduce power loss in the light from the excimer laser oscillator 21.

Furthermore, if a polyhedron prism 32 has sufficient dispersion, the prism 23 can be removed and a polyhedron prism 32 can function as both dispersion means and dividing means.

Figure 4:
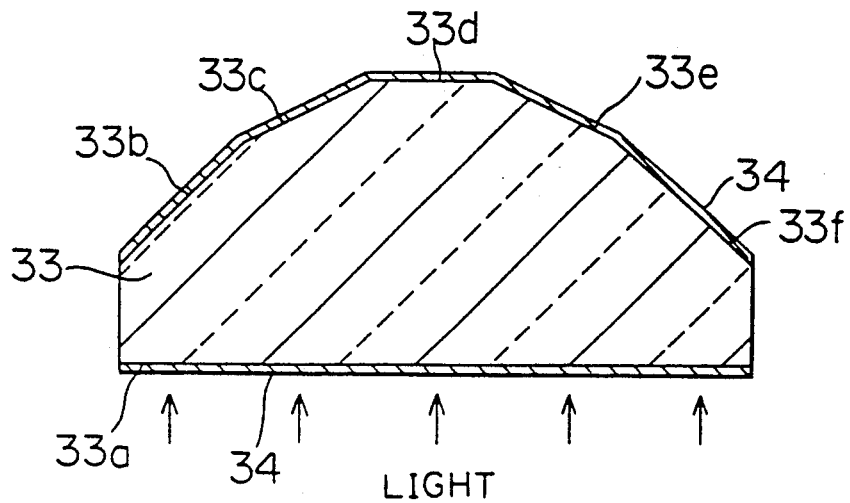
FIG. 4 is a cross sectional view of a polyhedron prism for use in a modification of the second embodiment.

Moreover, when a polyhedron prism has a large number of surfaces 33b to 33f as indicated in FIG. 4, the light is divided into a large number of light beams corresponding to these surfaces 33b to 33f. Thus, more effective averaging and better uniformity of illumination can be achieved. For practical use, it is preferable that a polyhedron prism have fifty to sixty surfaces. Still furthermore, if an antireflection film 34 is disposed on all surfaces 33a to 33f of a prism 33 through which light passes, it is possible to reduce the light power loss due to the reflection at the surfaces; thus, the throughput of a projection printer increases.

Figure 5:
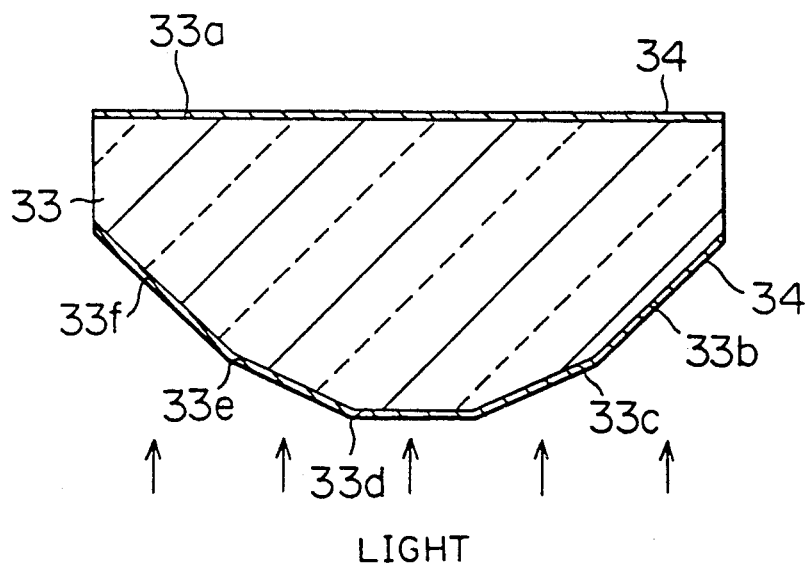
FIG. 5 is a cross sectional view of a polyhedron prism for use in another modification of the second embodiment.
Figure 6:
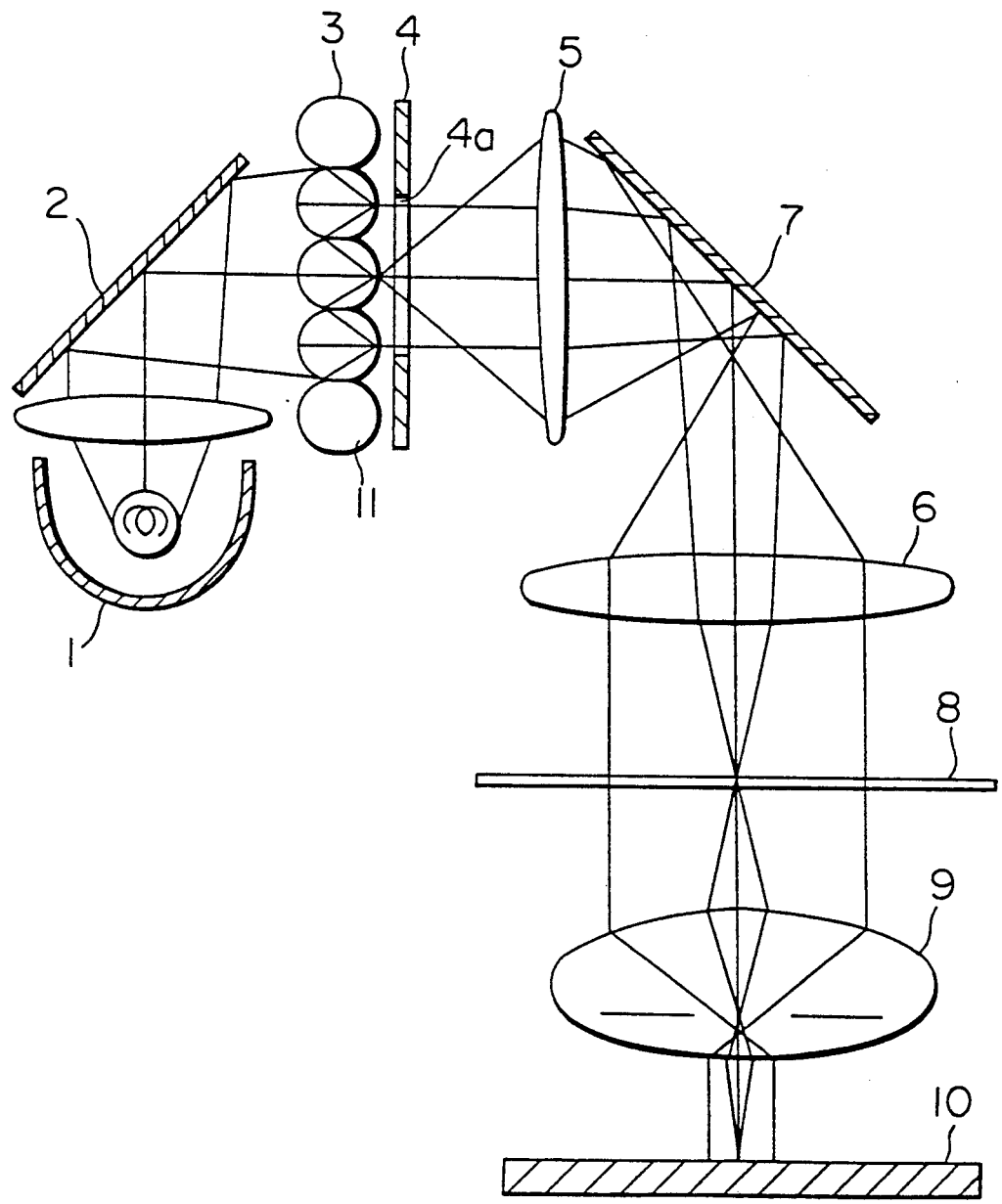
FIG. 6 is a schematic diagram showing an optical system of a conventional projection printer.
Figure 7:
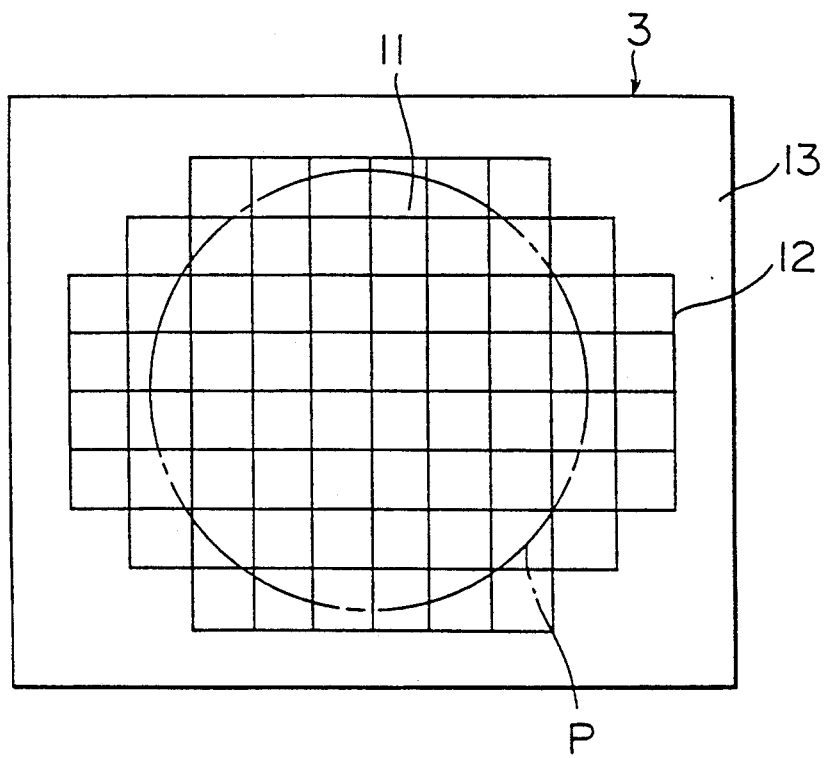
FIG. 7 is a plan view of a fly-eye lens unit used in a system of FIG. 6.

It is not necessarily required that light from an excimer laser oscillator 21 be incident on the largest principal surface of a polyhedron prism, but it is also possible, for example, that the polyhedron prism be arranged in the opposite direction so that the light is incident on the surfaces 33b to 33f, as shown in FIG. 5, emerges and from the largest principal surface 33a. Even in this case, the same effect can be obtained as in the case when light is incident on the largest principal surface 33a.

In embodiments described above, the excimer laser oscillator 21 used as a light source emits coherent light, but a light source which emits partially coherent light can also be used to get similar effects.

What is claimed is:

1. A projection exposure apparatus comprising:
   a light source emitting at least partially coherent light;
   dispersion means for dispersing the light according to wavelength;
   a polyhedron prism for dividing the dispersed light into plural light beams;
   a condenser unit for directing each of the plural light beams onto a mask including circuit patterns so that the beams overlap; and
   a projection lens unit for projecting the light passing through said mask onto a surface of a wafer.

2. A projection exposure apparatus as defined in claim 1 wherein said dispersion means is a prism.

3. A projection exposure apparatus as defined in claim 1 wherein said polyhedron prism has an antireflection film on said prism.

4. A projection exposure apparatus as defined in claim 1 wherein said polyhedron prism has fifty to sixty surfaces.

5. A projection exposure apparatus as defined in claim 1 wherein said light source emits coherent light.

6. A projection exposure apparatus as defined in claim 5 wherein said light source is an excimer laser.

7. A projection exposure apparatus as defined in claim 1 wherein said light source emits partially coherent light.

8. A projection exposure apparatus comprising:
   a light source emitting at least partially coherent light;
   dispersion means external to the light source for dispersing the light according to wavelength;
   dividing means for dividing the dispersed light into a plurality of light beams, the respective light beams having different wavelengths from each other;
   a condenser unit for directing each of the light beams onto a mask including circuit patterns so that the light beams overlap, the beams thereby mutually interfering in a heterodyne beat; and
   a projection lens unit for projecting the light passing through said mask onto a surface of a wafer.

9. The projection exposure apparatus as defined in claim 8 wherein said dividing means includes a polyhedron prism.

10. The projection exposure apparatus as defined in claim 9 wherein said polyhedron prism includes an antireflection film.

11. The projection exposure apparatus as defined in claim 9 wherein said polyhedron prism includes fifty to sixty surfaces.

12. The projection exposure apparatus as defined in claim 8 wherein said light source emits coherent light.

13. The projection exposure apparatus as defined in claim 8 wherein said light source is an excimer laser.

14. The projection exposure apparatus as defined in claim 8 wherein said light source emits partially coherent light.

15. The projection exposure apparatus as defined in claim 8 wherein said dispersion means includes a prism.

16. The projection exposure apparatus as defined in claim 8 wherein said dividing means includes a fly-eye lens.

* * * * *